United States Patent [19]

Fukino

[11] Patent Number: 4,772,762

[45] Date of Patent: Sep. 20, 1988

[54] PRINTED BOARD

[75] Inventor: Masahiro Fukino, Kamakura, Japan

[73] Assignee: Mitsubishi Denki Kabushiki Kaisha, Japan

[21] Appl. No.: 939,815

[22] Filed: Dec. 9, 1986

[30] Foreign Application Priority Data

Dec. 11, 1985 [JP] Japan ................................ 60-190421

[51] Int. Cl.$^4$ .............................................. H05K 1/18
[52] U.S. Cl. .................................. 174/68.5; 361/403; 361/406; 361/409
[58] Field of Search ................ 361/403, 406, 404, 409; 174/68.5

[56] References Cited

U.S. PATENT DOCUMENTS

| | | | |
|---|---|---|---|
| 3,833,838 | 9/1974 | Christiansen | 361/409 |
| 4,298,770 | 11/1981 | Nishihara | 361/409 X |
| 4,527,041 | 7/1985 | Kai | 361/409 X |
| 4,548,452 | 10/1985 | Gillett | 339/176 MP X |
| 4,551,789 | 11/1985 | Schettler et al. | 361/409 X |
| 4,562,513 | 12/1985 | Arnold et al. | 361/414 X |

Primary Examiner—R. R. Kucia

Attorney, Agent, or Firm—Leydig, Voit & Mayer

[57] ABSTRACT

A printed board capable of permitting the passage of at least two wiring patterns between two adjacent mounting lands on the surface of the printed board even if a clearance between the adjacent mounting lands is limited. Mounted on the printed board is an electrical component having a plurality of leads extending in a parallel relation with each other with limited clearances formed between adjacent leads. The printed board has a plurality of mounting lands to which the respective leads of the electrical component are secured as by soldering, there being a limited clearance defined between adjacent ones of the lands such that only one wiring pattern printed on the printed board can run through the clearance in the direction parallel to that in which the leads extend. The adjacent two lands have two facing parallel sides which are disposed in parallel with each other at an angle relative to the direction in which the leads extend, so that at least two wiring patterns, printed on the surface of the printed board, can run through the clearance between the facing sides of the adjacent lands in a parallel relation therewith.

6 Claims, 1 Drawing Sheet

PRINTED BOARD

BACKGROUND OF THE INVENTION

1. Field of the Invention

The present invention relates to a printed board adapted to have mounted thereon various electrical components or elements.

2. Description of the Prior Art

FIG. 2 shows an example of an electrical component mounted on a printed board. In this Figure, an electrical component 2 is mounted on a printed board 1 and has a plurality of leads 3 secured to corresponding mounting lands 4 formed as by printing on the surface of the printed board 1. In this case, as illustrated in FIG. 3, some of the leads 3 (on one side of the electrical component 2 in the illustrated embodiment) often extend in a parallel relation with each other with a limited clearance present between adjacent ones of the leads 3. Conventionally, the leads 3 are secured as by soldering to the corresponding mounting lands 4, which are formed on the surface of the printed board 1. In this connection, it is to be noted that due to the limited clearances between the adjacent leads 3, a clearance between adjacent mounting lands 4 on the printed board 1 (that is the distance between the facing sides 4a of the adjacent lands 4) is accordingly narrow so that it becomes possible to print only one wiring pattern of a predetermined width on the surface of the printed board 1 in the clearance between the adjacent mounting lands 4. Accordingly, another wiring pattern of the predetermined width having an additional electric path 6 can not fit through the clearance, and it becomes necessary to bypass the path 6 around one of the mounting lands 4.

With the conventional printed board 1 as constructed above, additional space is often required for permitting the passage of some of wiring which does not fit between the mounting lands 4, and, as a consequence, there arises a problem in that the wiring capacity on the printed board 1 having a specified area is reduced.

SUMMARY OF THE INVENTION

In view of the above, the present invention is intended to obviate the above-described problem of the prior art, and has for its object the provision of a novel and improved printed board of the kind described which is capable of permitting passage of at least two wiring patterns of the predetermined width between two adjacent mounting lands on the surface of the printed board even if a clearance between the adjacent mounting lands is limited.

In order to achieve the above object, according to one aspect of the present invention, there is provided a printed board adapted to have mounted thereon an electrical component having a plurality of leads which extend in a parallel relation with each other with limited clearances present between adjacent leads, the printed board having a plurality of mounting lands which is provided on the surface of the printed board, and to which the respective leads of the electrical component are to be secured, at least one side of each of the lands being arranged in a substantially parallel and facing relation with respect to at least one side of adjacent one of the lands and at an angle with respect to the direction of the leads of the electrical component.

According to another aspect of the present invention, there is provided a printed board adapted to have mounted thereon an electrical component having a plurality of leads which extend in a parallel relation with each other with limited clearances present between adjacent leads, the printed board having a plurality of mounting lands which is provided on the surface of the printed board, and to which the respective leads of the electrical component are to be secured, there being a limited clearance defined between adjacent ones of the lands such that only one wiring pattern of a predetermined width printed on the printed board can run through the clearance in the direction parallel to that in which the leads extend, the adjacent two lands having two facing parallel sides which are disposed in a parallel relation with each other at an angle relative to the direction in which the leads extend; and at least two wiring patterns of a predetermined width printed on the surface of the printed board and running through the clearance between the facing sides of the adjacent lands.

It is preferred that the wiring patterns extend in a parallel relation with the facing sides of the adjacent lands.

In one embodiment, the lands are formed in the shape of triangles which are disposed in a row and in alternatingly facing directions.

In another embodiment, the lands are formed in the shape of trapezoids which are disposed in a row and in alternatingly facing directions.

The above and other objects, features and advantages of the present invention will become apparent from the following detailed description of the presently preferred embodiments of the invention when taken in conjunction with the accompanying drawings.

DESCRIPTION OF THE PREFERRED EMBODIMENTS

Figure 1:
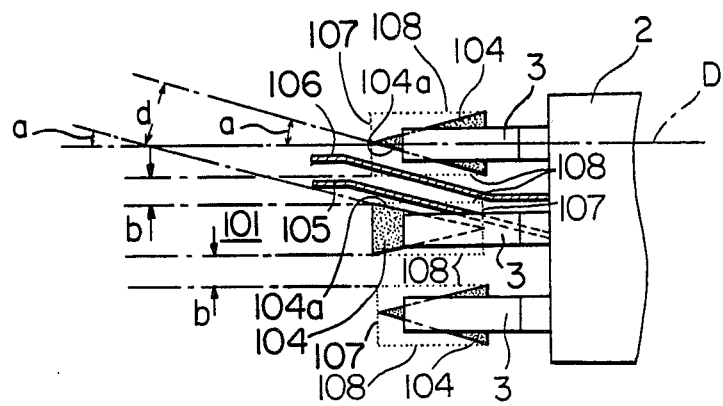
FIG. 1 is a plan view showing one embodiment of the present invention.

Now, the present invention will be described in detail with reference to the preferred embodiments thereof as illustrated in the drawings.

Figure 2:
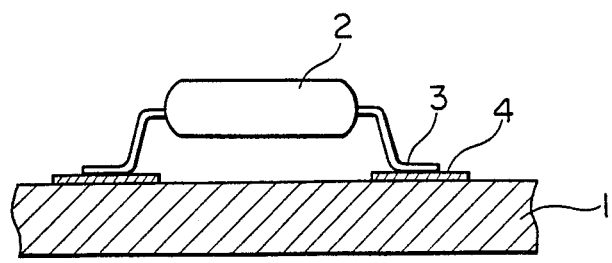
FIG. 2 is a side elevational view showing an example of an electrical component mounted on a conventional printed board.
Figure 3:
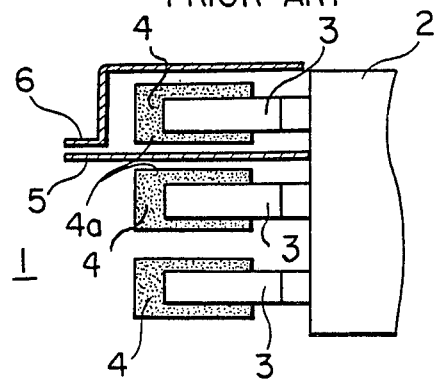
FIG. 3 is a plan view of the conventional printed board and the electrical component illustrated in FIG. 2.

In FIG. 1, the same components of the illustrated embodiment are identified by the same reference numerals as employed in FIGS. 2 and 3.

In FIG. 1, mounted on a printed board 101 of the present invention is an electrical component 2 which, similar to the one shown in FIGS. 2 and 3, has a plurality of leads 3 extending in a parallel relation with each other with limited clearances present between the adjacent ones of the leads 3.

According to the present invention, the printed board 101 is provided on its surface with a plurality of mounting lands 104 to which the respective leads 3 of the electrical component 2 are secured as by soldering. The mounting lands 104 of the printed board 101 are disposed at locations corresponding to the respective leads 3 of the electrical component 2. Each of the lands 104 has an equilateral-triangular configuration as illustrated in FIG. 1. Each of the lands 104 is disposed within an imaginary rectangular area 107. The areas 107 have long sides 108 parallel to the direction D of the lead 3 and in contact with edges of the lands 104. There is a clearance b between adjacent areas 107. A wiring pattern parallel to the direction D of the leads 3 would have to be disposed within the clearance b to avoid contact with the lands 104. Thus, the number of wiring patterns parallel to the direction D that may be disposed between adjacent lands is limited by the width of the clearance b. The lands 104 are arranged in a row and in an alternatingly facing directions such that the sides 104a of the adjacent triangular lands 104 facing each other are disposed in a spaced parallel relation with each other at a certain angle a relative to the direction D of the leads 3 (i.e., the direction in which the leads 3 extend in parallel). In this connection, it is to be noted that the angle a of the facing parallel sides 104a relative to the direction D of the leads 3 can be arbitrarily varied so as to change the clearance or distance d between the facing parallel sides 104a. In this manner, between the two facing slant sides 104 of adjacent mounting lands 104 there is formed a relatively wide or enlarged inclined clearance d through which two or more wiring patterns or electric paths 105, 106 of a predetermined width can be extended in a parallel relation with the facing slant sides 104. Since the clearance d between adjacent lands 104 shown in FIG. 1 is visibly greater than the clearance b, it will be seen that more wiring patterns of the predetermined width may be disposed through the clearance b at an acute angle a relative to the direction D than could be disposed through the clearance b parallel to the direction D. In this connection, each of the triangular-shaped lands 104 must have a sufficient area for ensuring a proper and satisfactory electrical contact between a respective one of the leads 3 and the corresponding mounting land 104. The alternating arrangement of the triangular lands 104 can provide a satisfactory contact area for each land 104, and at the same time a sufficiently large clearance or distance between the facing sides 104a of adjacent lands 104 to permit the passage of two or more wiring patterns 105, 106.

It should be noted that although the mounting lands 104 are each of a triangular configuration, they may be of other configurations such as, for example, a trapezoid which enables a formation of an inclined clearance between the facing parallel sides of respective adjacent lands. Further, the sides of the respective mounting lands 104 other than the facing parallel sides 104a may be of any configuration, and thus for example, may be parallel to the direction D of the leads 3. Also, it is possible to construct the printed board such that three or more wiring patterns of the predetermined width can pass through the clearance between the facing parallel sides 104a of adjacent mounting lands 104 on the printed board 101 if the clearance or distance between adjacent leads 3 of the electrical component 2 and hence between adjacent lands 104 on the printed board 101 is relatively wide.

Although in the above embodiment, it has been described that the facing sides 104a of adjacent lands 104 are in a parallel relation with each other, they need not be strictly parallel but may be nearly or substantially parallel.

As described in the foregoing, the present invention provides the following advantages. Specifically, in cases where a clearance or distance between adjacent mounting lands on the surface of a printed board is limited, the configurations of adjacent mounting lands can be varied such that the facing sides of the adjacent lands are disposed in a parallel relationship with respect to each other and at an angle relative to the direction of the leads, whereby it is possible to permit the passage of two or more wiring patterns of the predetermined width through the clearance between the facing sides of the adjacent lands. This serves to increase the capacity for accommodating a wiring arrangement on a specified area of a printed board.

What is claimed is:

1. A printed board having mounted thereon an electrical component having a plurality of leads which extend in a parallel relation with each other with limited clearances present between adjacent leads and having the component oriented thereon such that the leads extend in a direction parallel to an imaginary line on said board;

said printed board having a plurality of mounting lands provided on the surface of said printed board and to which the leads of the electrical component are soldered, said lands being disposed within imaginary rectangular areas on said board with long and short sides, the long sides being in contact with edges of the lands, the areas being disposed in a row such that the long side of each one of the areas face and are parallel to a long side of an adjacent one of the areas and are parallel to the imaginary line on said board, there being a limited first clearance between adjacent ones of said areas, each of said lands having at least one side arranged in a substantially parallel and facing relation with respect to at least one side of an adjacent one of said lands and at an acute angle relative to the imaginary line providing a limited second clearance between the side of the one of said lands and the side of the adjacent one of said lands which is greater than the first clearance; and at least two wiring patterns printed on the surface of said printed board and running through the second clearance between the facing sides of said adjacent lands.

2. A printed board as set forth in claim 1 wherein said wiring patterns extend in a parallel relation with the facing sides of said adjacent lands.

3. A printed board as set forth in claim 1 wherein said lands are each formed in the shape of a triangle, and are disposed in a row and in alternatingly facing directions.

4. A printed board as set forth in claim 1 wherein said lands are each formed in the shape of a trapezoid, and are disposed in a row and in alternatingly facing directions.

5. A printed board as set forth in claim 1 wherein said electrical component is an integrated circuit.

6. A printed board constructed to have mounted thereon an electrical component having a plurality of leads which extend in a parallel relation with each other with limited clearances present between adjacent leads and to have the component oriented thereon such that the leads extend in a direction parallel to an imaginary line on said board;

said printed board having a plurality of mounting lands provided on the surface of said printed board and to which the leads of the electrical component are to be soldered, said lands being disposed within imaginary rectangular areas on said board with long and short sides, the long sides being in contact with edges of the lands, the areas being disposed in a row such that the long side of each one of the areas face and are parallel to a long side of an adjacent one of the areas and are parallel to the imaginary line on said board, there being a limited first clearance between adjacent ones of said areas, each of said lands having at least one side arranged in a substantially parallel and facing relation with respect to at least one side of an adjacent one of said lands and at an acute angle relative to the imaginary line providing a limited second clearance between the side of the one of said lands and the side of the adjacent one of said lands which is greater than the first clearance; and at least two wiring patterns printed on the surface of said printed board and running through the second clearance between the facing sides of said adjacent lands.

* * * * *